(12) United States Patent
Hokomoto et al.

(10) Patent No.: US 7,045,856 B2
(45) Date of Patent: May 16, 2006

(54) SEMICONDUCTOR DEVICE

(75) Inventors: Yoshitaka Hokomoto, Kawasaki (JP); Akio Takano, Kawasaki (JP); Bungo Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/893,271

(22) Filed: Jul. 19, 2004

(65) Prior Publication Data

US 2005/0258478 A1 Nov. 24, 2005

(30) Foreign Application Priority Data

May 18, 2004 (JP) ............... 2004-148164

(51) Int. Cl.
*H01L 29/76* (2006.01)

(52) U.S. Cl. ..................... 257/328; 257/329

(58) Field of Classification Search ............... 257/302, 257/344, 328
See application file for complete search history.

(56) References Cited

U.S. PATENT DOCUMENTS

| 5,155,563 A | 10/1992 | Davies et al. |
| 2002/0167047 A1 | 11/2002 | Yasuhara et al. |
| 2004/0046202 A1* | 3/2004 | Nakayama et al. ......... 257/302 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

In a semiconductor layer of the first conductivity type, a first diffusion region of the second conductivity type is formed which includes a low resistance layer and a high resistance layer. This semiconductor layer of the first conductivity type has its thickness that is less than or equal to the lateral width of the high resistance layer.

8 Claims, 6 Drawing Sheets ional No. is based upon and claims the benefit of priority from the prior Japanese Patent Application No. 2004-148164, filed on May 18, 2004, the entire content of which is incorporated herein by reference.

BACKGROUND OF THE INVENTION

1. Field of the Invention

The present invention relates to semiconductor devices, and also relates to a semiconductor device which is arranged to flow a current from a first diffusion region toward a second diffusion region, which are formed on the top surface side of a semiconductor substrate, and further flow such current to an electrode formed at a back surface of the semiconductor substrate.

2. Description of the Related Art

The structure of a lateral type n-channel MISFET which is as one example of semiconductor devices of the type stated above is known from JP-A-2003-31805 (Paragraphs [0009] to [0014] and FIG. 25, etc.) for example. This structure will be explained while referring to FIG. 7 and FIG. 8. FIG. 7 is a diagram showing a plan view of the lateral type n-channel MISFET, and FIG. 8 is a cross-sectional view as taken along line A–A' of FIG. 7. In this MISFET, an epitaxial layer 40 of p− type is formed on or above a semiconductor substrate 30 of p+ type made of silicon, by way of example. The layer 40 is higher in electrical resistance than the semiconductor substrate 30 and is different in gradient of impurity concentration from the semiconductor substrate. On this epitaxial layer 40, a drain diffusion layer 50 of n type is formed. The drain diffusion layer 50 is designed to have a lightly doped drain (LDD) structure having high resistance drain layers 50A (high resistance layers) which are placed at the both ends and are low in impurity concentration and a low resistance drain layer 50B (low resistance layer) which resides at a central portion and is high in impurity concentration. The low resistance drain layer 50B is arranged to have high impurity concentration for purposes of reduction of contact resistance between it and a drain electrode 55; on the other hand, the high resistance drain layer 50A is low in impurity concentration in order to prevent reduction of withstand or "breakdown" voltage.

Base diffusion layers 70 of p type are formed at the both edge portions of this drain diffusion layer 50. A gate electrode 75 is formed through a dielectric film 76 at a position neighboring upon the high resistance drain layer 50A that overlies this base diffusion layer 70. At the base diffusion layer 70 immediately underlying this gate electrode 75, a channel section 71 is formed by control of a gate voltage. As shown in FIG. 7, the gate electrode 75 is arranged to extend at right angles toward the direction of each circuit element from a gate electrode wiring line 75T. The gate electrode wiring line 75T is applied a gate voltage from a wiring line 75W and a contact portion 75C.

A source diffusion layer 80 of n type is formed above the base diffusion layer 70 in such a manner that this layer is symmetrical with the drain diffusion layer 50, with the gate electrode 75 being interposed therebetween. This source diffusion layer 80 is electrically connected to a short-circuit electrode 85 (a source electrode), together with the base diffusion layer 70. The drain electrode 55, gate electrode 75 and short-circuit electrode 85 are electrically insulated or isolated from one another by a dielectric film 86. The short-circuit electrode 85 is electrically coupled to a contact layer 90 of heavily doped p (p+) type, which is formed to penetrate the epitaxial layer 40 to reach the semiconductor substrate 30, whereby it is short-circuited to the gate electrode 75 and a source electrode 100 that is formed on the back surface of the semiconductor substrate 30. The drain diffusion layer 50, base diffusion layer 70, source diffusion layer 80 and contact layer 90 are fabricated by a photolithography process including the steps of selectively implanting an impurity onto the epitaxial layer 40 and then diffusing the impurity by thermal processing.

In this arrangement, when giving the gate electrode 75 a gate voltage greater than or equal to the threshold voltage, a channel is formed in the channel section 71, causing electrons for use as carriers to flow from the drain electrode 55 toward the short-circuit electrode 85 through the drain diffusion layer 50 and channel section 71 plus source diffusion layer 80. Thus, a current with positive holes (holes) being as carriers flows from the short-circuit electrode 85 to the source electrode 100.

In this lateral type MISFET shown in FIGS. 7 and 8, the high resistance drain layer 50A is arranged so that its lateral width X is set at an appropriate value by taking into consideration any possible drop-down of the withstand voltage and rise-up of turn-on (ON) resistance. More specifically, in order to lower the ON resistance of MISFET, it is desirable that the width X be as short as possible. However, when the width X becomes shorter, the withstand voltage dropdown becomes problematic. Due to this, in the lateral type MISFET shown in FIGS. 7–8, design is done to minimize the width X within a certain range in which the withstand voltage required is obtainable.

In the lateral type MISFET with the width X shortened in this way and with the epitaxial layer 40 being made greater in thickness Y in comparison with this X value, when applying a reverse bias voltage (setting the drain electrode 55 at a positive voltage and letting the gate electrode 75 and source electrode 100 be grounded), the resultant electric field tends to most concentrate on terminate end portions of the gate electrode 75 that is in contact with the drain diffusion layer 50. As a result, "hot" carriers are injected into the gate electrode 75 beyond the dielectric film 76's potential barrier. This would result in occurrence of fluctuation of the threshold voltage of such gate. Additionally, upon injection of the hot carriers, the high resistance drain layer 50A decreases in carrier density or concentration, whereby there is a problem that the ON resistance increases.

SUMMARY OF THE INVENTION

A semiconductor device in accordance with one aspect of this invention, a semiconductor device comprises a semiconductor substrate of a first conductivity type, an epitaxial layer of the first conductivity type which is formed above the semiconductor substrate, a first diffusion region of a second conductivity type including a low resistance layer having a first impurity concentration formed at the epitaxial layer and a high resistance layer which is formed adjacent to this low resistance layer and which has a second impurity concentration lower than the first impurity concentration, a first electrode electrically connected to the first diffusion region, a base region of the first conductivity type which is formed in the epitaxial layer so that it is adjacent to the first diffusion region, a gate electrode formed through a dielectric film while being adjacent to the base region, a second diffusion region of the second conductivity type formed adjacent to the base region, a third electrode electrically connected to the second diffusion region and the base region, a contact region of the first conductivity type penetrating the epitaxial layer for electrical connection of the third electrode and the semiconductor substrate, and a second electrode connected to the semiconductor substrate at a back surface of the semiconductor substrate, characterized in that the thickness of the epitaxial layer is less than or equal to the lateral width of the high resistance layer.

A semiconductor device in accordance with another aspect of the invention comprises a semiconductor substrate of a first conductivity type, a semiconductor layer of the first conductivity type which is formed above the semiconductor substrate and is different therefrom in gradient of impurity concentration, a first diffusion region of a second conductivity type including a low resistance layer which is formed in the semiconductor layer of the first conductivity type and which has a first impurity concentration and a high resistance layer which is formed adjacent to this low resistance layer and has a second impurity concentration lower than the first impurity concentration, a first electrode electrically connected to the first diffusion region, a base region of the first conductivity type as formed in the semiconductor layer of the first conductivity type to neighbor the first diffusion region, a gate electrode formed through a dielectric film while being adjacent to the base region, a second diffusion region of the second conductivity type which is formed adjacent to the base region, a third electrode electrically connected to the second diffusion region and the base region, a contact region of the first conductivity type which penetrates the semiconductor layer of the first conductivity type for electrically connecting together the third electrode and the semiconductor substrate, and a second electrode connected to the semiconductor substrate at a back surface of this semiconductor substrate, featured in that the thickness of the semiconductor layer of the first conductivity type is less than or equal to the lateral width of the high resistance layer.

DETAILED DESCRIPTION OF THE INVENTION

Figure 1:
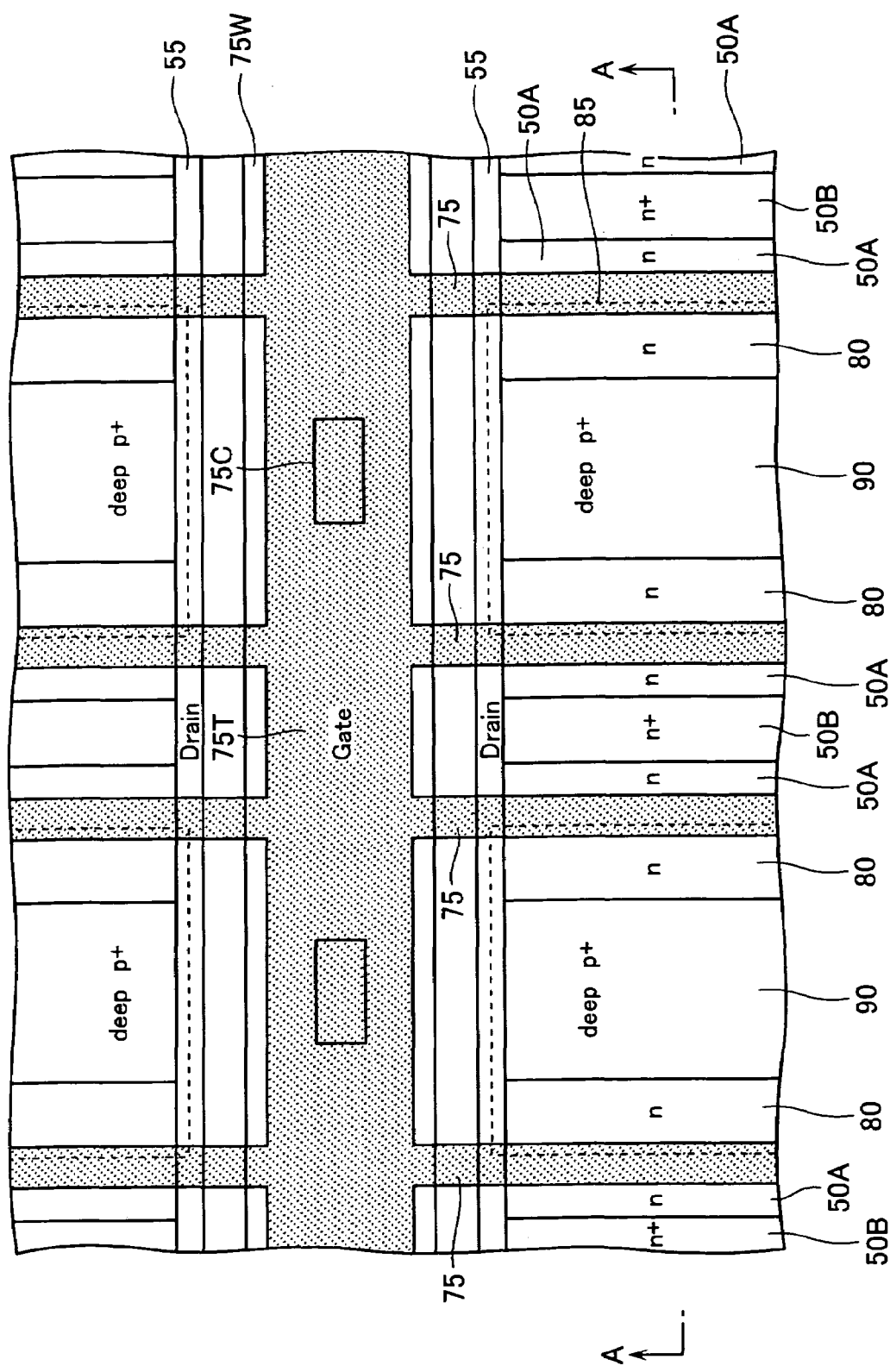
FIG. 1 is a diagram showing a plan view of a semiconductor device in accordance with an embodiment of this invention.
Figure 2:
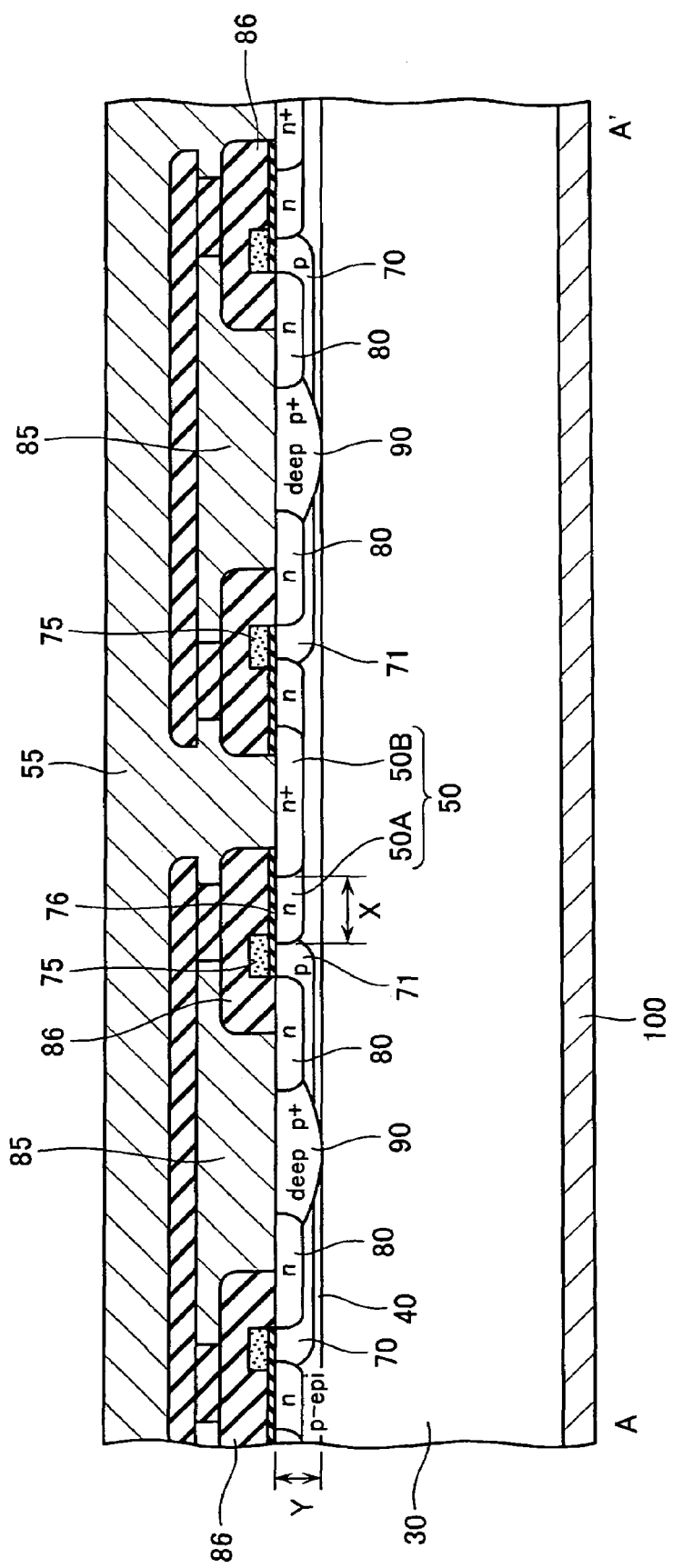
FIG. 2 is a cross-sectional view of the device as taken along line A–A' of FIG. 1.
Figure 3:
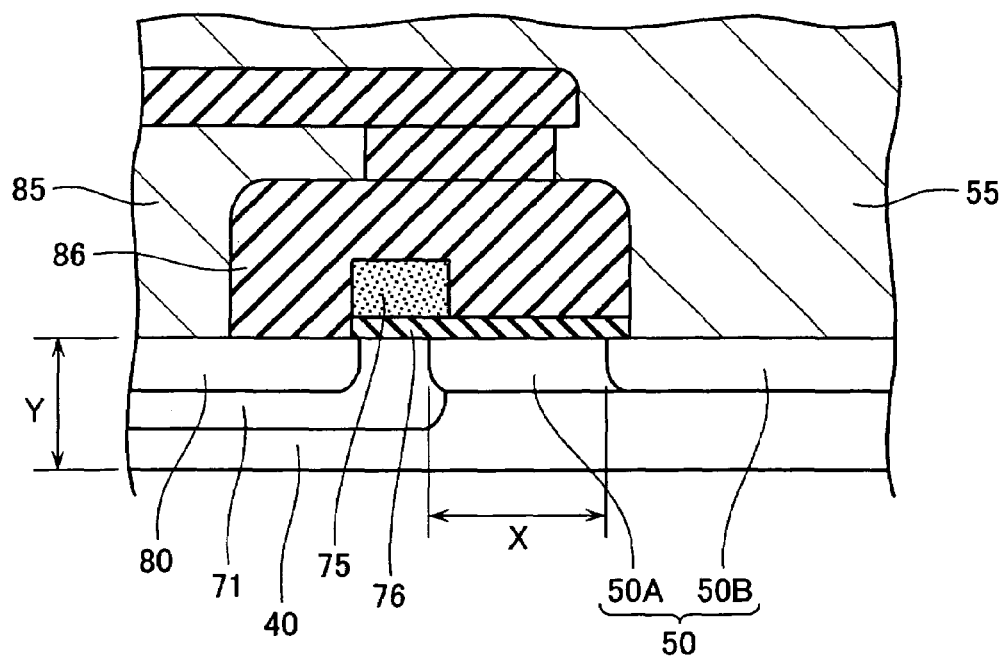
FIG. 3 is an enlarged view of a part adjacent to a high resistance drain layer 50A of FIG. 1 while letting it include an epitaxial layer 40.
Figure 7:
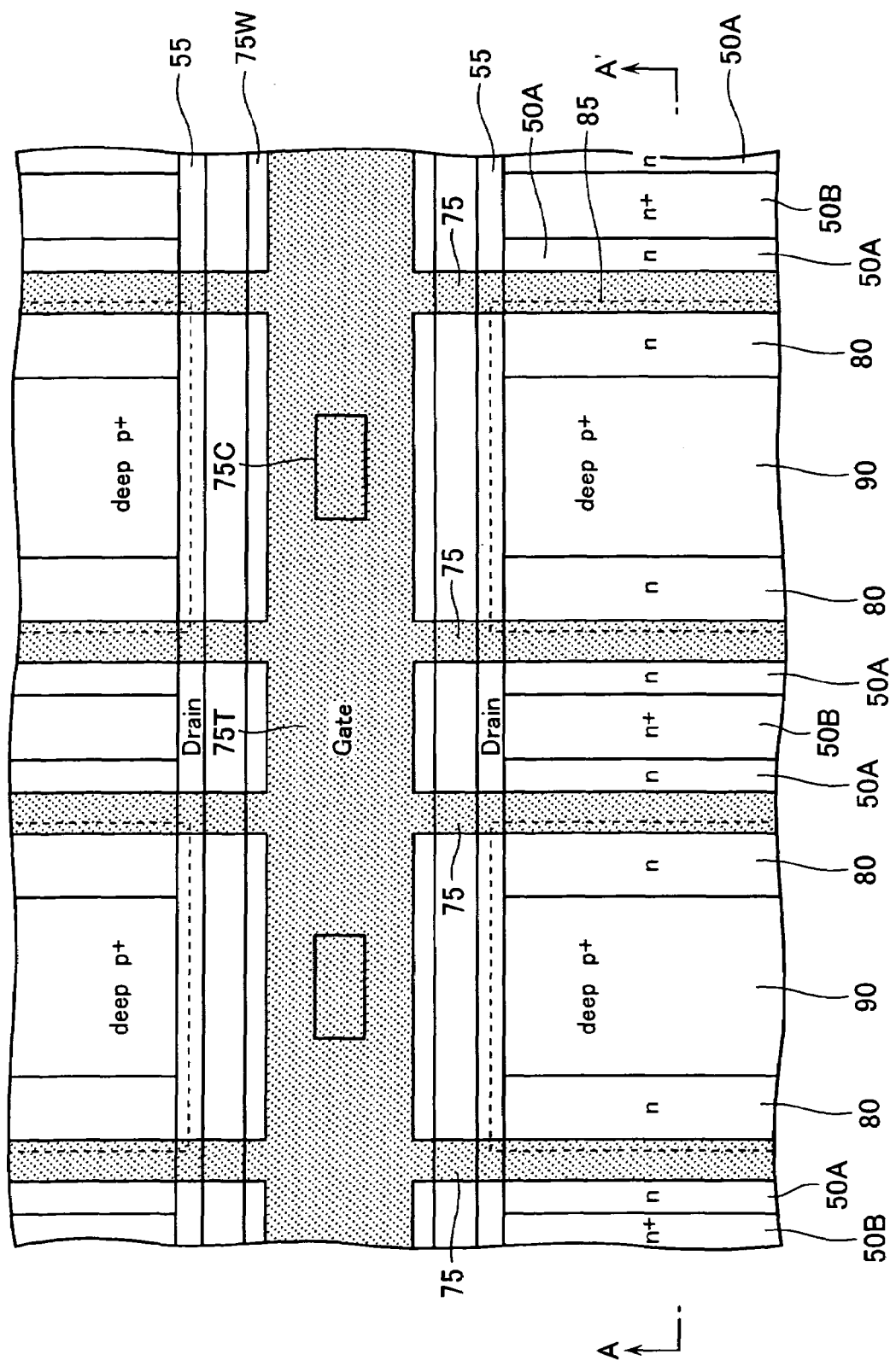
FIG. 7 is a plan view of one prior art semiconductor device.
Figure 8:
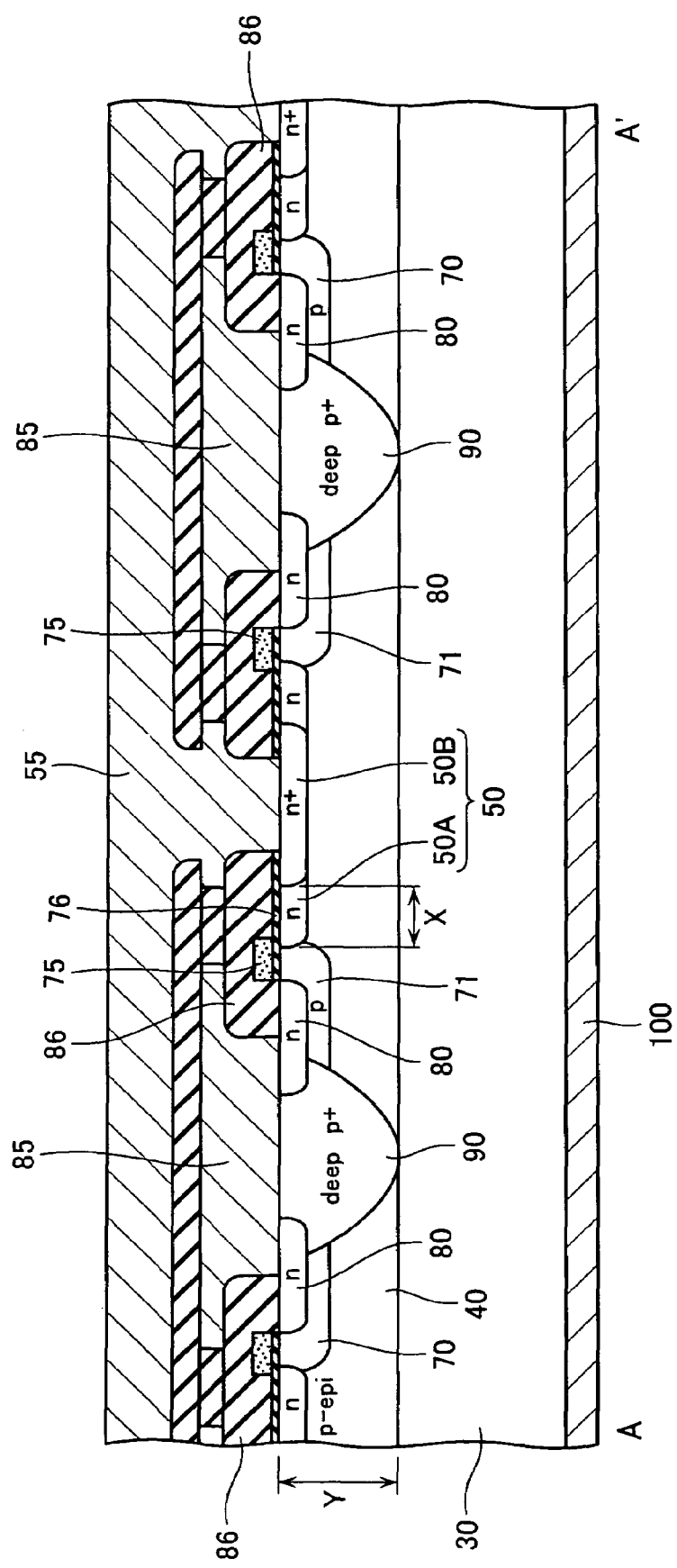
FIG. 8 is an A–A' sectional view of FIG. 7.

An embodiment of the invention will next be explained in detail with reference to FIGS. 1 and 2. FIG. 1 shows a plan view of a lateral type n-channel MISFET, and FIG. 2 is a cross-sectional view taken along line A–A' of FIG. 1. As shown in FIG. 1, the n-channel MISFET of this embodiment is the same in planar layout as the prior known MOSFET shown in FIGS. 7 and 8. Note however that unlike the MOSFET shown in FIGS. 7–8, the n-channel MISFET of this embodiment is such that the thickness Y of an epitaxial layer 40 is less than or equal to the lateral width X of the high resistance drain layer 50A of drain diffusion layer 50 (see FIG. 3).

When the thickness Y is relatively lessened in this way, the significance of a depletion layer at a junction between the epitaxial layer 40 and the low resistance drain layers 50B at the time of a reverse bias application becomes a size that is not negligible with respect to the thickness Y. The result is that an electric field concentrates not only on the edge portions of gate electrode 75 but also on the junction between an edge portion of the low resistance drain layer 50B and the epitaxial layer 40. As a result, the electric field intensity at the edges of gate electrode 75 is relatively weakened or "relaxed," thereby causing the possibility of hot carrier injection into the gate electrode 75 to become lower. Thus, the possibility of threshold voltage variation and ON resistance rise-up becomes lower, resulting in circuit elements becoming higher in reliability when compared to the prior art.

Figure 4:
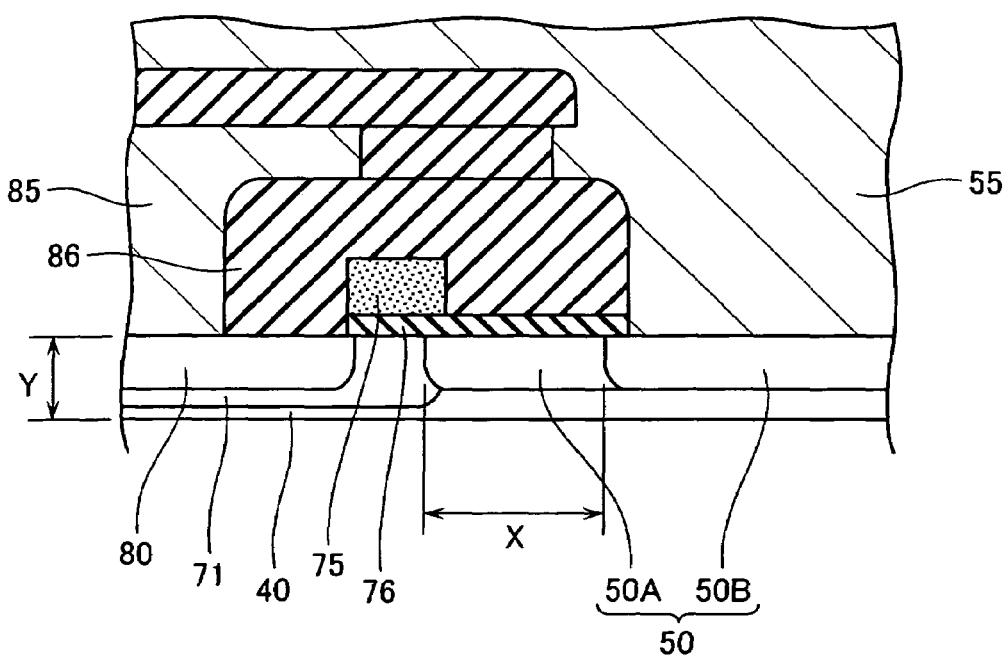
FIG. 4 is an enlarged view of a part near the high resistance drain layer 50A of FIG. 1, including the epitaxial layer 40.

It should be noted that it is possible to make the thickness Y of epitaxial layer 40 thinner to the extent that permits asymptotic adjacency to a bottom portion of the drain diffusion layer 50 as shown in FIG. 4. The less the thickness Y, the weaker the electric field concentration to the ends of gate electrode 75.

Figure 5:
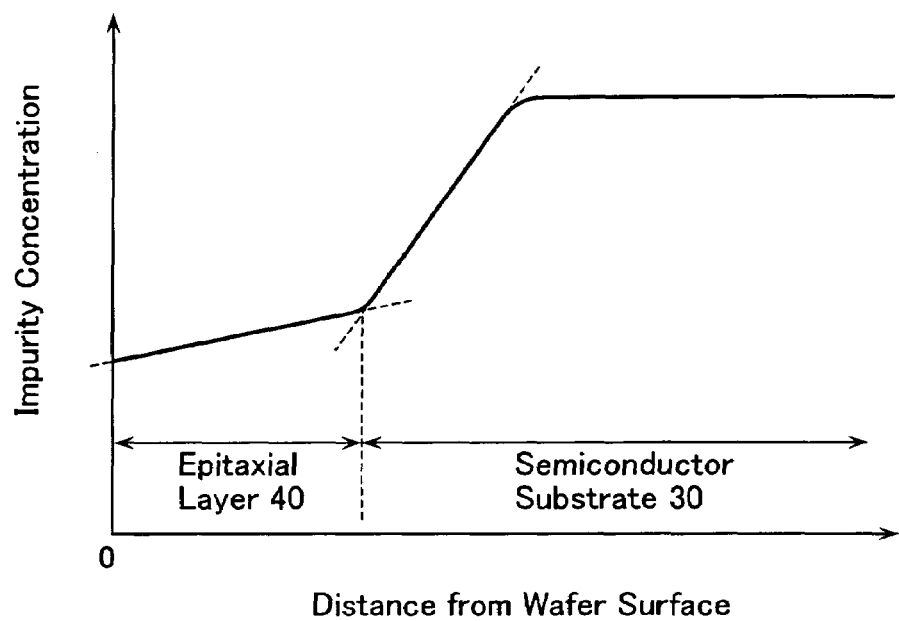
FIG. 5 is an explanation diagram of a method for defining the boundary position of a semiconductor substrate 30 and the epitaxial layer 40.

Additionally in this embodiment, as shown in FIG. 5, the cross point of a tangential line of a change curve line of the impurity concentration in the epitaxial layer 40 and a tangent line of change curve of the impurity concentration in the semiconductor substrate 30 is defined as a boundary position of the epitaxial layer 40 and the semiconductor substrate 30. The above-noted thickness Y is determined in accordance with this definition. Regarding a boundary position of the high resistance drain layer 50A and low resistance drain layers 50B also, definition is made by a similar method.

Figure 6:
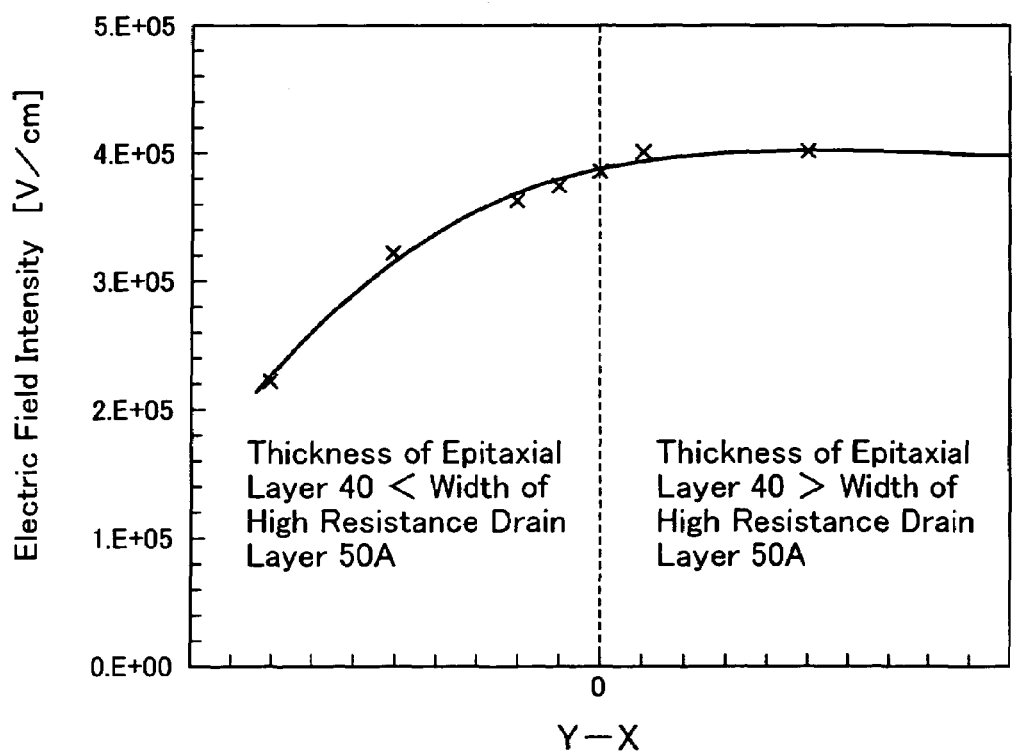
FIG. 6 is a graph showing a simulation result of the relationship of a difference (Y−X) between the thickness Y of epitaxial layer 40 and the lateral width X of high resistance drain layer 50A versus the intensity of an electric field at an edge portion of a gate electrode 75.

FIG. 6 is a simulation result while letting the structure of the MOSFET shown in FIG. 1 be a model, which shows how the electric field intensity at the edge of gate electrode 75 varies relative to a difference, Y−X, from the thickness X in case the thickness Y of epitaxial layer 40 is changed variously. In this example, simulation is done under an assumption that the impurity concentration of the epitaxial layer 40 falls within a range of from 2e+15 to 5e+15 [/cm$^3$], the impurity concentration of the low resistance drain layer 50B and source diffusion layer 80 is within a range of 5e+19 to 1e+20 [/cm$^3$], the impurity concentration of high resistance drain layer 50A ranges from 5e+16 to 2e+17 [/cm$^3$], and the impurity concentration of base diffusion layer 70 is 5e+15 to 3e+17 [/cm$^3$]. Although it can be said that these impurity concentration values are within an ordinary range in the lateral type MOSFET such as shown in FIG. 1, it was demonstrated that with the setting of any value within this range, the electric field intensity at the edge of gate electrode 75 begins to decrease at or near a point whereat the value Y becomes equal to X (i.e., Y−X=0) as shown in FIG. 6. And, when letting Y further decrease in comparison with X, it is possible to further lower the electric field intensity.

Although in the above-noted embodiment the explanation was made while using the n-channel MOSFET as an example, this invention is similarly applicable to any one of p-channel type MOSFETs and IGBTs. It is also possible to make use of semiconductor substrates other than the semiconductor substrate 30 made of silicon, which substrates are made of GaAs, SiC, CaN, SiSe, C and any equivalents thereto.

What is claimed is:

1. A semiconductor device comprising:
   a semiconductor substrate of a first conductivity type;
   an epitaxial layer of the first conductivity type formed above said semiconductor substrate;
   a first diffusion region of a second conductivity type including a low resistance layer having a first impurity concentration formed at said epitaxial layer and a high resistance layer being formed adjacent to this low resistance layer and having a second impurity concentration lower than said first impurity concentration;
   a first electrode electrically connected to said first diffusion region;
   a base region of the first conductivity type formed in said epitaxial layer to be adjacent to said first diffusion region;
   a gate electrode formed through a dielectric film while being adjacent to said base region;
   a second diffusion region of the second conductivity type formed adjacent to said base region;
   a third electrode electrically connected to said second diffusion region and said base region;
   a contact region of the first conductivity type penetrating said epitaxial layer for electrical connection of said third electrode and said semiconductor substrate; and
   a second electrode connected to said semiconductor substrate at a back surface of said semiconductor substrate;
   wherein said epitaxial layer has a thickness less than or equal to a lateral width of said high resistance layer substantially the same as a thickness of said first diffusion region and second diffusion region.

2. The semiconductor device according to claim 1, wherein the impurity concentration of said epitaxial layer is within a range of 2e+15 to 5e+15 [/cm$^3$],
   the impurity concentration of said low resistance layer and said second diffusion region is within a range of 5e+19 to 1e+20 [/cm$^3$],
   the impurity concentration of said high resistance layer is within a range of 5e+16 to 2e+17 [/cm$^3$], and
   the impurity concentration of said base region is within a range of 5e+15 to 3e+17 [/cm$^3$].

3. The semiconductor device according to claim 1, wherein a boundary position of said epitaxial layer and said semiconductor substrate is defined by a cross point of a tangential line of a change curve of impurity concentration in said epitaxial layer and a tangential line of a change curve of impurity concentration in said semiconductor substrate.

4. The semiconductor device according to claim 1, wherein a boundary position of said high resistance layer and said low resistance layer is defined by a cross point of a tangential line of a change curve of impurity concentration in said low resistance layer and a tangential line of a change curve of impurity concentration in said high resistance layer.

5. A semiconductor device comprising:
   a semiconductor substrate of a first conductivity type;
   a semiconductor layer of the first conductivity type being formed above said semiconductor substrate and being different from said semiconductor substrate in gradient of impurity concentration;
   a first diffusion region of a second conductivity type including a low resistance layer being formed in said semiconductor layer of the first conductivity type and having a first impurity concentration and a high resistance layer being formed adjacent to this low resistance layer and having a second impurity concentration lower than said first impurity concentration;
   a first electrode electrically connected to said first diffusion region;
   a base region of the first conductivity type as formed in said semiconductor layer of the first conductivity type to neighbor said first diffusion region;
   a gate electrode formed through a dielectric film while being adjacent to said base region;
   a second diffusion region of the second conductivity type formed adjacent to said base region;
   a third electrode electrically connected to said second diffusion region and said base region;
   a contact region of the first conductivity type penetrating said semiconductor layer of the first conductivity type for electrically connecting together said third electrode and said semiconductor substrate; and
   a second electrode connected to said semiconductor substrate at a back surface of said semiconductor substrate,
   wherein said semiconductor layer of the first conductivity type has a thickness less than or equal to a lateral width of said high resistance layer and substantially equal to a thickness of said first diffusion region and second diffusion region.

6. The semiconductor device according to claim 5, wherein the impurity concentration of said semiconductor layer of the first conductivity type is within a range of 2e+15 to 5e+15 [/cm$^3$],
   the impurity concentration of said low resistance layer and said second diffusion region is within a range of 5e+19 to 1e+20 [/cm$^3$],
   the impurity concentration of said high resistance layer is within a range of 5e+16 to 2e+17 [/cm$^3$], and
   the impurity density of said base region is within a range of 5e+15 to 3e+17 [/cm$^3$].

7. The semiconductor device according to claim 5, wherein a boundary position of said semiconductor layer of the first conductivity type and said semiconductor substrate is defined by a cross point of a tangential line of a change curve of impurity concentration in said semiconductor layer of the first conductivity type and a tangential line of a change curve of impurity concentration in said semiconductor substrate.

8. The semiconductor device according to claim 5, wherein a boundary position of said high resistance layer and said low resistance layer is defined by a cross point of a tangential line of a change curve of impurity concentration in said low resistance layer and a tangential line of a change curve of impurity concentration in said high resistance layer.

* * * * *